United States Patent [19]

Yashiro

[11] Patent Number: 4,785,277
[45] Date of Patent: Nov. 15, 1988

[54] NARROWLY-ADJUSTABLE RESISTOR
[75] Inventor: Toshiaki Yashiro, Miyagi, Japan
[73] Assignee: Alps Electric Co., Ltd., Japan
[21] Appl. No.: 7,615
[22] Filed: Jan. 28, 1987
[30] Foreign Application Priority Data Apr. 21, 1986 [JP] Japan .............................. 61-58689[U]

[51] Int. Cl.[4] ...................... H01C 10/32; H01C 10/38
[52] U.S. Cl. ................................... 338/162; 29/610.1;
338/184; 338/272; 338/276
[58] Field of Search ............... 338/162, 163, 164, 184,
338/333, 271, 272, 273, 274, 276, 312, 313;
29/610 R

[56] References Cited
U.S. PATENT DOCUMENTS 2,138,210 11/1938 Schellenger ..................... 338/313 X
3,757,083 9/1973 Dietz et al. ...................... 338/313 X
4,329,676 5/1982 McDonald et al. ................. 338/198
4,465,994 8/1984 Rehberger ........................... 338/164

Primary Examiner—E. A. Goldberg
Assistant Examiner—M. M. Lateef
Attorney, Agent, or Firm—Guy W. Shoup; Paul J. Winters

[57] ABSTRACT

A narrowly-adjustable resistor has a slider rotatably mounted on a resistor base, a case containing the slider and the resistor base, and terminals connecting to the slider and the resistor base, respectively. Each terminal extends through the bottom of the case to the outside, its exposed extension part including a stem and a branch or branches extends to the sides of the case to permit soldering of the terminal to an electrode on the substrate.

3 Claims, 5 Drawing Sheets

NARROWLY-ADJUSTABLE RESISTOR

BACKGROUND OF THE INVENTION

1. Field of the Invention

This invention relates to an adjustable resistor of which resistance is finely adjustable, for example, during the period of or after having completed assembly of an electric circuit, and more particularly to the terminals of such a resistor.

2. Description of the Prior Art

FIG. 5 illustrates in section an adjustable resistor known in the prior art; FIG. 6 gives a perspective view of the same. In these drawings, reference character 1 designates a molded box-shaped case consisting of a bottom 2 and side walls 3, and the upper opening of the case 1 is indicated by reference character 3a. In the molded case 1, there are provided a resistor base 4 which has a resistor pattern thereon, and a slider mounted rotatably on the resistor base 4. The slider is provided with an engagement notch 5a for rotating it substantially at the center of the upper part and a slidable contact 5b as the lower part. There is further provided an eyelet 6 just fitted in a center through hole 4a of the resistor base 4. The upper flanged end of the eyelet 6 is forcedly placed on the inside surface of the slider 5. The lower end of the eyelet 6 extends through a side wall of the case 1 at a relatively lower level to the outside, and further downwards alongside the side wall and the undersurface of the bottom 2 to embrace the edge of the bottom, as indicated with reference character 6a.

The resistor base 4 has thereon a resistor pattern of which both ends 7 extend through the side wall of the molded case 1 at a relatively low level to the outside, and further downwards alongside the side wall and the undersurface of the bottom 2 to embrace the edge of the bottom, as in the case of terminal 6a.

The opening 3a of the molded case 1 is covered with a cover 8 of heatproofing film adhered or fused to the edges of the molded case 1.

Referring to FIGS. 7 and 8 illustrative of the process of soldering this adjustable resistor 9 to a printed circuit substrate 10, which has on the surface electrodes 11 of copper foil arranged in a predetermined pattern in opposed relation to the terminals 6a and 7 of the adjustable resistor 9.

The adjustable resistor 9 is attached provisionally to the printed circuit substrate 10 by means of an adhesive 12 with the terminals 6a and 7 opposed to the electrodes 11.

The printed circuit substrate 10 with the resistor 9 provisionally attached thereto is immersed in solder jet 13 to solder the terminals 6a and 7 to the electrodes 11 for completing electrical connection between them.

For preventing solder or flux from invading in the molded case 1 because, if it occurred, there would be danger of impairing the function of the resistor, the opening 3a of the molded case 1 is closed with a cover 8.

After the attachment of the adjustable resistor 9 to the printed circuit substrate 10, the cover 8 is removed by tearing off or breaking through. Then an adjuster is inserted to bring its lower end into engagement with the engagement notch 5a of the slider, and the slidable contact 5b is rotated by sliding on the resistor pattern to adjust it to a desired resistance value.

Now in the process of soldering the adjustable resistor 9 of the prior art to the printed circuit substrate 10, the problem is encountered that, as shown in FIG. 7, solder jet 13 flows in a curve in the vicinity of the area of electrodes 11 of the printed circuit base 10 and the terminals 6a and 7 of the adjustable resistors. However, it is difficult to make the solder flow into the area, because solder jet 13 has a large interfacial tension such that it forms a spherical surface for a small interface, for example, at the corner in this case.

Notably, referring to FIGS. 9 and 10, in the process where a plurality of adjustable resistors 9 are attached to a printed circuit substrate (10), at short intervals with the terminals 6a and 7 interopposed, the narrower the gap "A" between the opposed side walls of the adjacent resistors 9, the more difficult the penetration of solder jet 13 into the gap "A" becomes. This results in the defect that the solder jet cannot enter the areas of the terminals 6a and 7 in the gap A. Accordingly, it is impossible to make concurrent attachment of a plurality of such adjustable resistors to a printed circuit substrate 10. Thus has arisen a great problem in the way of high density attachment.

It therefore is an object of the invention to solve the above-stated problem encountered in the prior art and to provide an adjustable resistor permitting concurrent attachment of resistors at a high density to printed circuit substrate by soldering the terminals to the electrodes of a printed circuit substrate.

The object is attainable by the construction according to the invention that an adjustable resistor comprises a slider rotatably mounted on a resistor base, a case containing the slider and the resistor base, and terminals connecting to the slider and the resistor base, respectively, and extending through the bottom of the case to the outside. Fine adjustment of the resistance value is accomplishable by rotating the slider on the resistor base, wherein the terminals have exposed parts each consisting of a stem extending alongside the side wall of the case from the bottom close to the upper edge and branch parts extending laterally close to the side edge.

The above-described construction according to the invention enables foil-proof soldering of the terminals to the electrodes. Each terminal has an extension alongside the sidewall of the case consisting of an upright stem and mono- or bilateral branches for inducing solder flow towards the area where the terminals and electrodes are to be soldered together without fail.

DESCRIPTION OF PREFERRED EMBODIMENTS OF THE INVENTION

Figure 1:
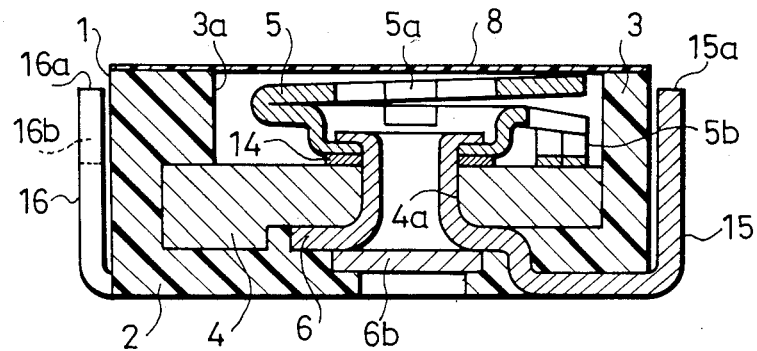
FIG. 1 is a longitudinal-sectional view of a adjustable resistor embodying the invention.
Figure 2:
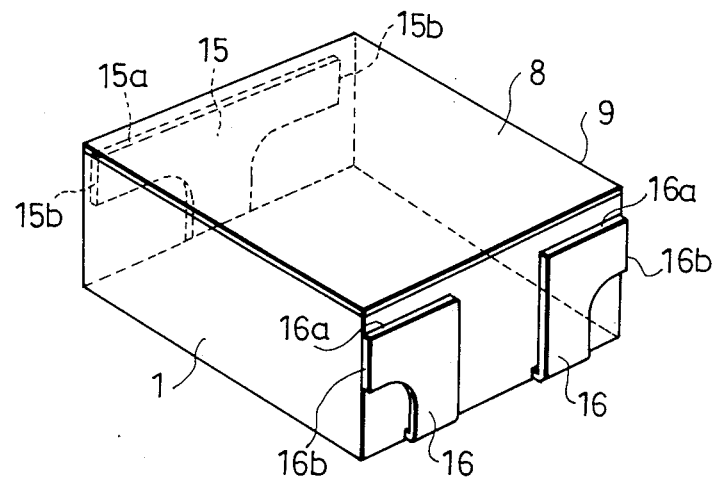
FIG. 2 is a perspective view of the same.
Figure 5:
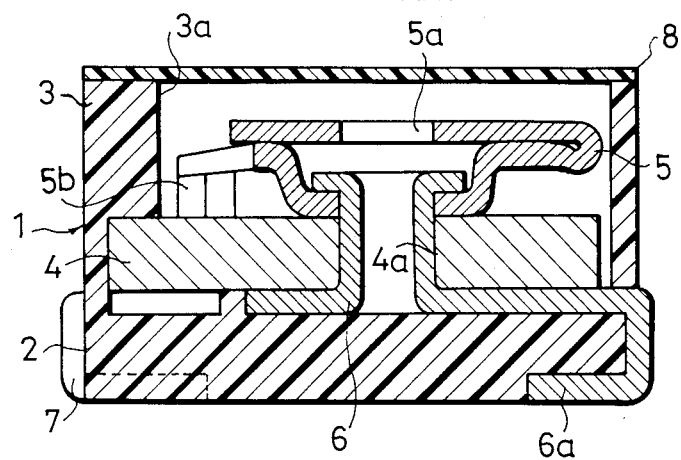
FIGS. 5 and 6 are longitudinal sectional and perspective views of a prior art adjustable resistor.
Figure 6:
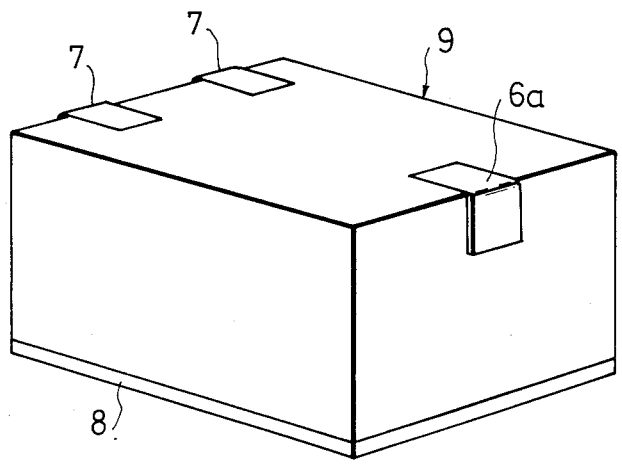
Figure 7:
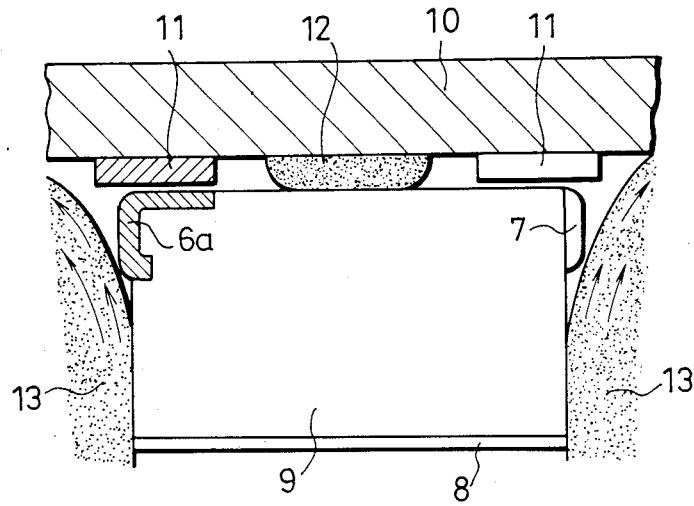
FIGS. 7 and 8 are different front views illustrative of the process of soldering the prior art resistor to a printed circuit substrate.
Figure 8:
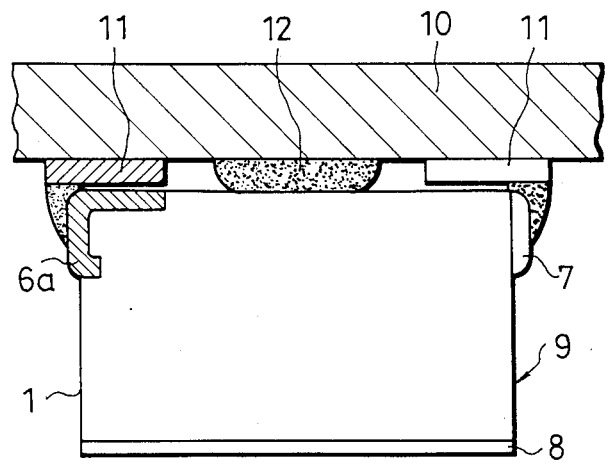

The invention will be described more fully by way of examples with reference to the accompanying drawings hereinafter:

Referring to FIGS. 1 and 2 giving sectional and perspective views of an embodiment of a adjustable resistor according to the invention, corresponding parts or components are designated by the same numerical references as in the prior art example described above referring to FIGS. 5 and 6.

A molded case 1 consists of a bottom 2 and side walls 3, a resistor base 4 and a slider 5 mounted, using a washer 14 as spacer, on the resistor base 2 and rotatably held by means of an eyelet 6. The eyelet 6 sits, at the lower end, on the folded part 6b used as a lid for closing the bottom 2, and its lower end running through the bottom 2 to the outside of the case 1, and constitutes an exposed extension part 15, termed an intermediate terminal. On the other hand, the resistor base 4 has thereon a resistor pattern (not shown), of which a pair of terminals 16 likewise extends through the bottom to the outside of the case 1 to constitute the exposed part.

As shown in FIG. 2, alongside opposed side walls of the mold case 1, the intermediate terminal 15 has a T-shaped part and the pair of terminals 16 of the resistor pattern have inverse L-shaped parts opposed to each other. The upper ends 15a and 16a of the T-shaped terminal 15 and the inverse L-shaped terminals 16 are at the level proximate to the upper edges of the molded case 1, and the branch ends 15b of the T-shaped part 15 and those 16b of inverse L-shaped parts 16 are little short of the side edges of the molded case 1.

Figure 3:
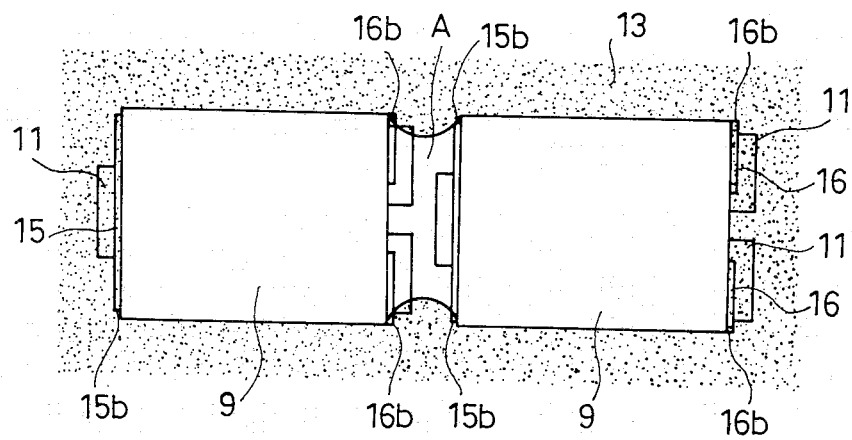
FIGS. 3 and 4 are bottom and front views illustrating the process for soldering a plurality of the resistors to a printed circuit substrate.
Figure 4:
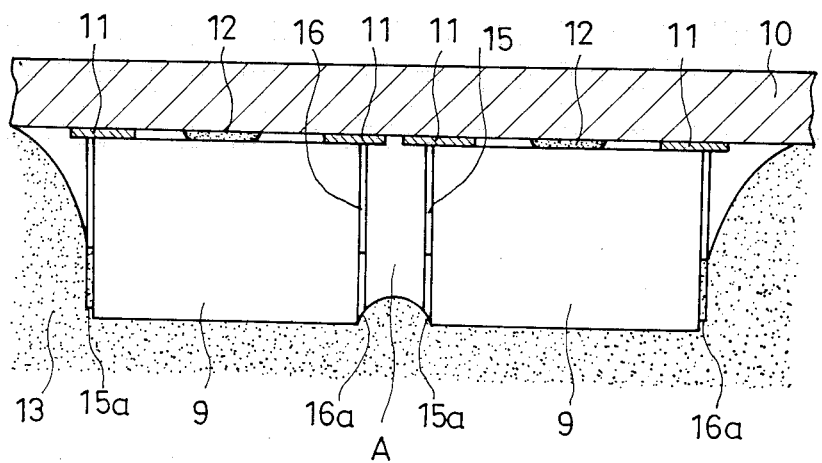

FIGS. 3 (bottom view) and 4 (partially-sectional front view) illustrate the process for soldering at a time a plurality (2 pieces in this example) of adjustable resistors 9 having the above-stated structure side by side on a printed circuit substrate 10.

Figure 9:
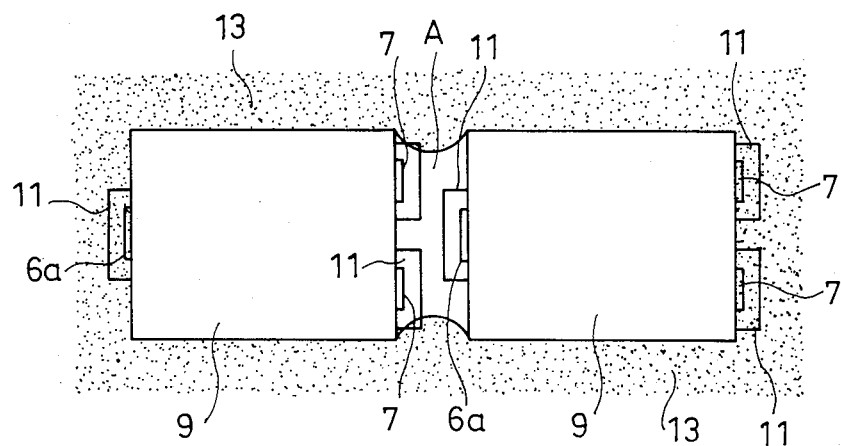
FIGS. 9 and 10 are bottom and front views illustrative of the process for soldering a plurality of the same prior art resistors to a printed circuit substrate.
Figure 10:
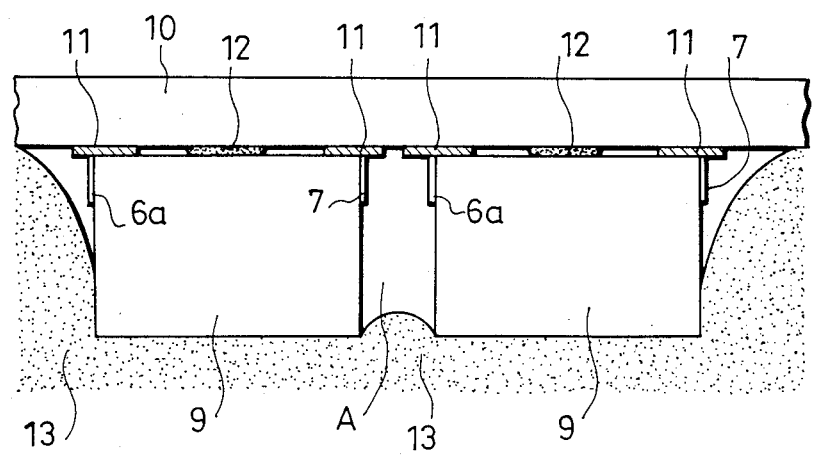

As understood from these drawings, each adjustable resistor 9 is provisionally attached at the undersurface by means of an adhesive to a predetermined site of the printed circuit substrate. The resultant print substrate 10 is turned upside-down, and immersed in a solder jet 13. In this case as in the prior art illustrated referring to FIGS. 9 and 10, the solder jet forms convex spherical surfaces due to the interfacial tension at the edge portions of the gap A defined by the opposed side walls of two resistors 9 adjacent to each other and at the corners defined by the remaining side walls of the resistors and the printed circuit substrate 10. In the present example, however, the exposed parts of the terminals extend both upwards and laterally nearly to the outside of the gap (A) that they contact with a solder jet and get wet with solder. Once a part of the solder jet contacts with the ends (15a, 15b, 16a, 16b) of terminal 15 or 16, the terminals get wet with solder, which flows on the surface towards the bottom portion. Thus soldering together each electrode 11 of the printed circuit substrate 10, and the intermediate terminal 15 or an inverse L-shaped terminal 16 can be accomplished.

As described above, the adjustable resistors 9 according to the invention can be soldered at one time side by side to a printed circuit substrate 10. As a matter of course, a similar effect can be attained in soldering a sufficiently-spaced arrangement or a single piece.

Furthermore, instead of the T-shaped and inverse L-shaped terminals 15 and 16 in the above-stated example, other shapes for the terminal parts may be used so long as their stems and branches extend sufficiently close to the upper and side edges of the outer case of the adjustable resistor.

The advantages of the invention reside, as described above, in permitting soldering without fail between electrodes of a printed circuit substrate and terminals of adjustable resistors because of their shapes assuring the contact of adjustable resistors with a solder jet in the vicinity of the edges of the cases, thus enabling high-density attachment of the resistors to the substrate.

What is claimed is:

1. In an adjustable resistor having a slider rotatably mounted on a resistor base for adjusting a resistance value of said resistor, a case containing said slider and said resistor base formed by an upper wall, side walls, and a bottom wall, and terminals connected to said slider and said resistor base, respectively, which extend through the bottom wall to the outside of said case, wherein said resistor is to be mounted with its bottom wall on a surface of a printed circuit substrate and its terminals soldered to corresponding electrodes provided on the surface of the substrate, the improvement wherein:

said slider is mounted on said resistor base by an eyelet having a lower folded part which forms part of the bottom wall closing said case and a lower end which constitutes one of the terminals extending through the bottom wall to the outside of said case;

said terminals extending through the bottom wall of said case to the outside thereof are each bent so as to have a stem part thereof extending upwards along a respective one of the side walls and terminating close to a peripheral edge defined by the upper wall and one side wall, and a branch part thereof extending sidewards to a peripheral edge defined by the one side wall and an adjacent side wall, and solder from a solder jet is applied from the direction of the upper wall of the resistor case and induced to flow along said stem part or said branch part of the terminal to the bottom wall of said case on the substrate to reliably solder each terminal to a respective electrode on the substrate.

2. An adjustable resistor as defined in claim 1, wherein the upper wall includes an upper opening of said case covered with a protective film through which said slider on said resistor base is adjusted.

3. In a method of making an adjustable resistor having a slider rotatably mounted on a resistor base for adjusting a resistance value of said resistor, a case containing said slider and said resistor base formed by an upper wall, side walls, and a bottom wall, and terminals connected to said slider and said resistor base, respectively, which extend through the bottom wall to the outside of said case, and mounting said resistor with its bottom wall on a surface of a printed circuit substrate and soldering its terminals to corresponding electrodes provided on the surface of the substrate, the improvement wherein said terminals extending through the bottom wall of said case to the outside thereof are each bent so as to have a stem part thereof extending upwards along a respective one of the side walls and terminating close to a peripheral edge defined by the upper wall and one side wall, and a branch part thereof extending sidewards to a peripheral edge defined by the one side wall and an adjacent side wall, and solder from a solder jet is applied from the direction of the upper wall of the resistor case to solder each terminal to a respective electrode on the substrate is induced to flow along said stem part or said branch part of the terminal toward the bottom wall of said case on the substrate.

* * * * *